(12) United States Patent
Fish et al.

(10) Patent No.: US 8,310,413 B2
(45) Date of Patent: Nov. 13, 2012

(54) ELECTROLUMINESCENT DISPLAY DEVICES

(75) Inventors: David A. Fish, Haywards Heath (GB); Nigel D. Young, Redhill (GB); Herbert Lifka, Son (NL); Andrea Giraldo, 'S-Hertogenbosch (NL); Wouter Oepts, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 967 days.

(21) Appl. No.: 10/598,822

(22) PCT Filed: Mar. 2, 2005

(86) PCT No.: PCT/IB2005/050768
§ 371 (c)(1),
(2), (4) Date: May 16, 2007

(87) PCT Pub. No.: WO2005/091262
PCT Pub. Date: Sep. 29, 2005

(65) Prior Publication Data
US 2007/0241998 A1    Oct. 18, 2007

(30) Foreign Application Priority Data
Mar. 17, 2004  (GB) .................................. 0406107.3

(51) Int. Cl.
G09G 3/30 (2006.01)
G09G 5/00 (2006.01)
G09G 3/10 (2006.01)
G06F 3/033 (2006.01)
H01J 3/14 (2006.01)
H01J 1/62 (2006.01)
H01L 27/15 (2006.01)

(52) U.S. Cl. ............ 345/76; 250/216; 257/79; 313/498; 315/169.1; 345/204

(58) Field of Classification Search ............... 257/79–80; 315/169.1–169.3; 345/36, 45–46, 48, 55, 345/58, 76–83, 204–207; 313/498, 506, 313/169.1–169.3; 250/216
See application file for complete search history.

(56) References Cited

U.S. PATENT DOCUMENTS
5,751,261 A * 5/1998 Zavracky et al. ............... 345/55
(Continued)

FOREIGN PATENT DOCUMENTS
EP        717446 A2    6/1996
(Continued)

OTHER PUBLICATIONS
ISR: PCT/IB05/050768.
(Continued)

Primary Examiner — Bipin Shalwala
Assistant Examiner — Matthew Fry

(57) ABSTRACT

An active matrix display device comprises an array of display pixels, with each pixel comprising an EL display element, a light-dependent device for detecting the brightness of the display element and a drive transistor circuit for driving a current through the display element. The drive transistor is controlled in response to the light-dependent device output so that ageing compensation can be implemented. The light-dependent device is located laterally of the area of light emitting material of the EL display element. In this way, the light-dependent device does not cause step coverage problems and can be integrated into the pixel layout without affecting the pixel aperture. Furthermore, the light dependent device can extend alongside the full length of the area of light emitting material so that it receives light input from a large part of the display element area.

21 Claims, 8 Drawing Sheets

U.S. PATENT DOCUMENTS

| | | | |
|---|---|---|---|
| 6,320,325 | B1 | 11/2001 | Cok et al. |
| 6,424,326 | B2 * | 7/2002 | Yamazaki et al. ............... 345/77 |
| 6,774,578 | B2 * | 8/2004 | Tanada ....................... 315/169.4 |
| 7,068,246 | B2 * | 6/2006 | Yamazaki et al. ............... 345/76 |
| 2001/0026125 | A1 * | 10/2001 | Yamazaki et al. ............. 313/505 |
| 2002/0027229 | A1 * | 3/2002 | Yamazaki et al. ............... 257/84 |
| 2002/0079512 | A1 * | 6/2002 | Yamazaki et al. ............. 257/200 |
| 2002/0180672 | A1 * | 12/2002 | Yamazaki et al. ............... 345/77 |
| 2003/0047736 | A1 * | 3/2003 | Hayashi et al. ................. 257/79 |
| 2004/0031965 | A1 * | 2/2004 | Forrest et al. ................... 257/79 |
| 2005/0253790 | A1 * | 11/2005 | Uchida .......................... 345/76 |
| 2006/0132401 | A1 * | 6/2006 | Yamazaki et al. ............... 345/81 |
| 2008/0170007 | A1 * | 7/2008 | Tanada .......................... 345/76 |

FOREIGN PATENT DOCUMENTS

| | | |
|---|---|---|
| EP | 1096466 A1 | 5/2001 |
| WO | 0120591 A1 | 3/2001 |

OTHER PUBLICATIONS

Written Opinion: PCT/IB05/050768.

* cited by examiner

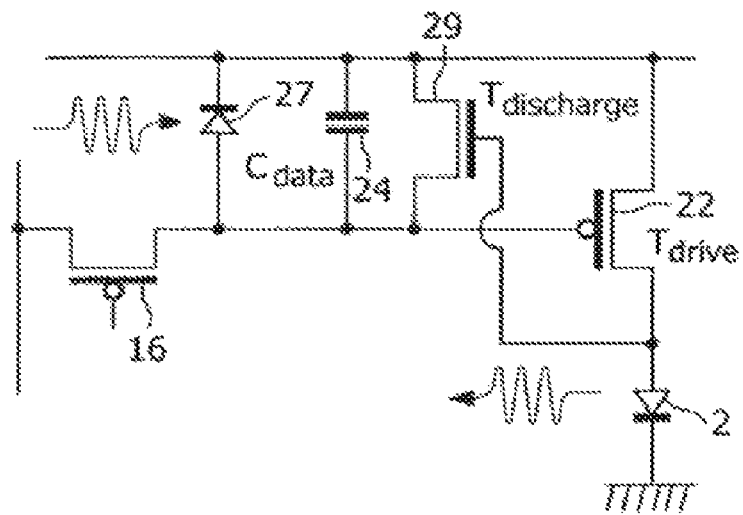
FIG. 3  PRIOR - ART
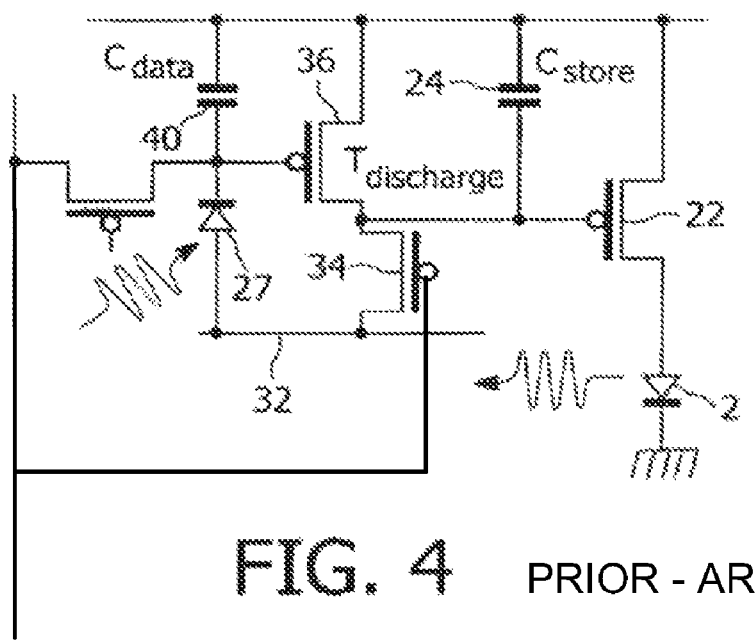
FIG. 4  PRIOR - ART

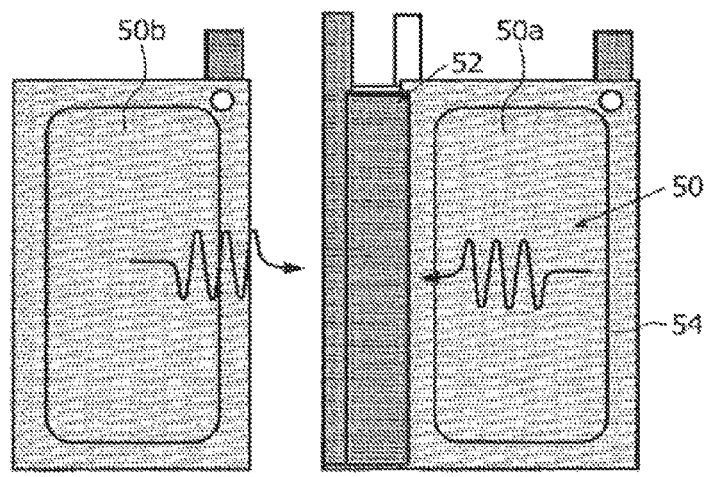
FIG. 5    PRIOR - ART
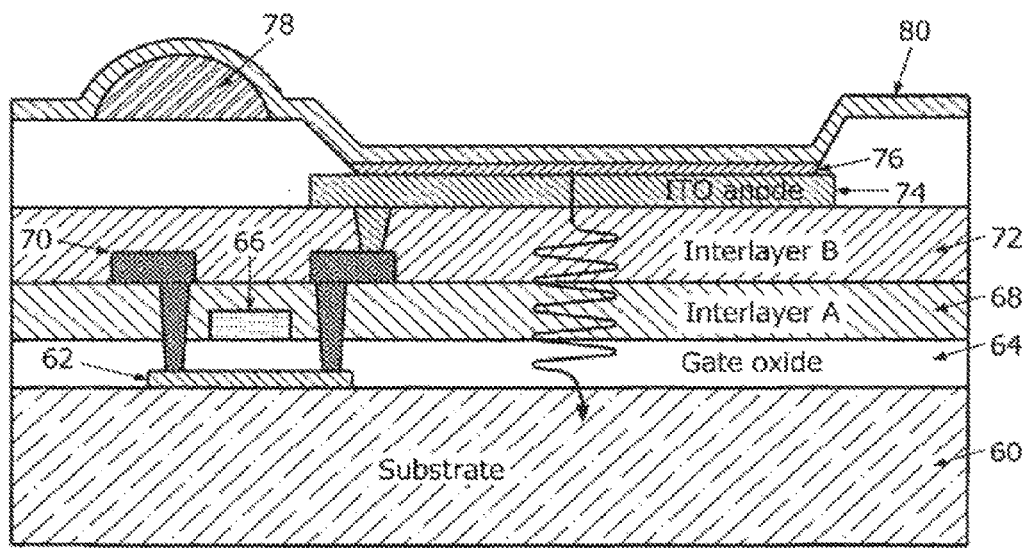
FIG. 6    PRIOR - ART

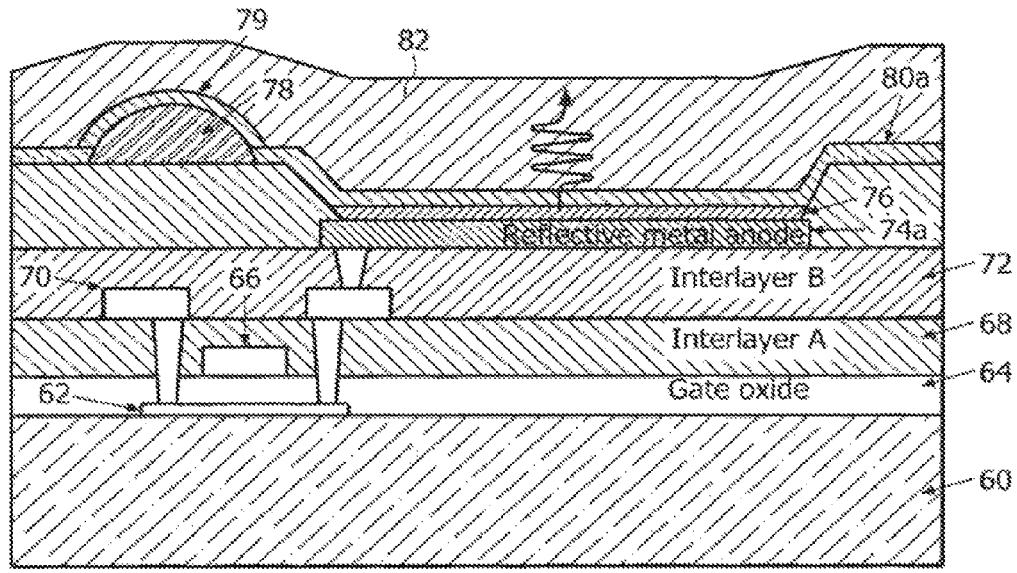
FIG. 7   PRIOR - ART
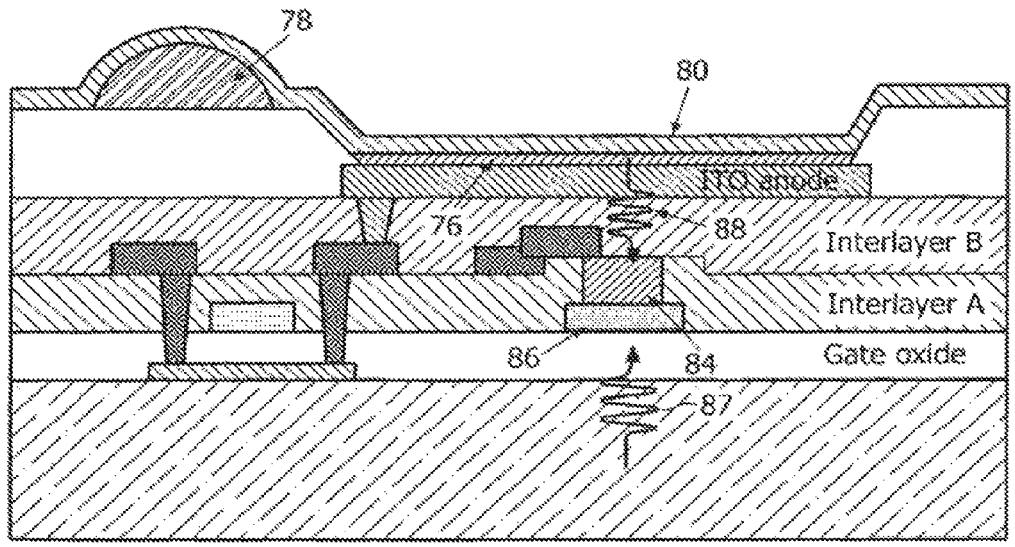
FIG. 8   PRIOR - ART

ELECTROLUMINESCENT DISPLAY DEVICES

This invention relates to electroluminescent display devices, particularly active matrix display devices having an array of pixels comprising light-emitting electroluminescent display elements and thin film transistors. More particularly, but not exclusively, the invention is concerned with an active matrix electroluminescent display device whose pixels include light sensing elements which are responsive to light emitted by the display elements and used in the control of energisation of the display elements.

Matrix display devices employing electroluminescent, light-emitting, display elements are well known. The display elements commonly comprise organic thin film electroluminescent elements, (OLEDs), including polymer materials (PLEDs), or else light emitting diodes (LEDs). The term LED used below is intended to cover all of these possibilities. These materials typically comprise one or more layers of a semiconducting conjugated polymer sandwiched between a pair of electrodes, one of which is transparent and the other of which is of a material suitable for injecting holes or electrons into the polymer layer.

The display elements in such display devices are current driven and a conventional, analogue, drive scheme involves supplying a controllable current to the display element. Typically a current source transistor is provided as part of the pixel configuration, with the gate voltage supplied to the current source transistor determining the current through the electroluminescent (EL) display element. A storage capacitor holds the gate voltage after the addressing phase. An example of such a pixel circuit is described in EP-A-0717446.

Each pixel thus comprises the EL display element and associated driver circuitry. The driver circuitry has an address transistor which is turned on by a row address pulse on a row conductor. When the address transistor is turned on, a data voltage on a column conductor can pass to the remainder of the pixel. In particular, the address transistor supplies the column conductor voltage to the current source, comprising the drive transistor and the storage capacitor connected to the gate of the drive transistor. The column, data, voltage is provided to the gate of the drive transistor and the gate is held at this voltage by the storage capacitor even after the row address pulse has ended. The drive transistor in this circuit is implemented as a p-channel TFT, (Thin Film Transistor) so that the storage capacitor holds the gate-source voltage fixed. This results in a fixed source-drain current through the transistor, which therefore provides the desired current source operation of the pixel. The brightness of the EL display element is approximately proportional to the current flowing through it.

In the above basic pixel circuit, differential ageing, or degradation, of the LED material, leading to a reduction in the brightness level of a pixel for a given drive current, can give rise to variations in image quality across a display. A display element that has been used extensively will be much dimmer than a display element that has been used rarely. Also, display non-uniformity problems can arise due to the variability in the characteristics of the drive transistors, particularly the threshold voltage level.

Improved voltage-addressed pixel circuits which can compensate for the ageing of the LED material and variation in transistor characteristics have been proposed. These include a light sensing element which is responsive to the light output of the display element and acts to leak stored charge on the storage capacitor in response to the light output so as to control the integrated light output of the display element during the drive period which follows the initial addressing of the pixel. Examples of this type of pixel configuration are described in detail in WO 01/20591 and EP 1 096 466. In an example embodiment, a photodiode in the pixel discharges the gate voltage stored on the storage capacitor and the EL display element ceases to emit when the gate voltage on the drive transistor reaches the threshold voltage, at which time the storage capacitor stops discharging. The rate at which charge is leaked from the photodiode is a function of the display element output, so that the photodiode serves as a light-sensitive feedback device.

With this arrangement, the light output from a display element is independent of the EL display element efficiency and ageing compensation is thereby provided. Such a technique has been shown to be effective in achieving a high quality display which suffers less from non-uniformities over a period of time. However, this method requires a high instantaneous peak brightness level to achieve adequate average brightness from a pixel in a frame time and this is not beneficial to the operation of the display as the LED material is likely to age more rapidly as a result.

In an alternative approach, the optical feedback system is used to change the duty cycle with which the display element is operated. The display element is driven to a fixed brightness, and the optical feedback is used to trigger a transistor switch which turns off the drive transistor rapidly. This avoids the need for high instantaneous brightness levels, but introduces additional complexity to the pixel.

The use of optical feedback systems is considered as an effective way of overcoming differential ageing of the LED display elements.

One problem with these compensation schemes is that they are not easily implemented with a top-emitting structure. The difficulty with top emission is that light cannot enter the photo-sensor in the active matrix because the anode will cover most of the pixel electronics and it will generally be highly reflective and non-transmitting.

Another problem relates to the efficiency and implementation of the optical feedback element. Two types of optical sensor have been considered. One approach is that a low temperature polysilicon (LTPS) TFT can be used as a light sensitive element, gated with the ITO LED anode. Alternatively, an extra transparent ITO level can be added into the technology to provide a gate for the photo TFT instead of the LED anode. A difficulty is that the conversion efficiency from photons to electrons is very low in the green and red bands (e.g. 2% and 1% respectively). Therefore, large devices that fill the aperture are required. These large devices also present other difficulties such as large dark currents and high parasitic capacitance.

A second approach is to integrate an amorphous silicon PIN/NIP photodiode with the LTPS process. This results in highly efficient optical sensors, for example RGB efficiencies of 80%, 70% and 40% respectively. This enables very small NIP devices to be used in the pixel. However, this also means that edge non-uniformities that occur when defining the device will be important and will create differences across the display. Also, a small device will only sample a small area of the LED pixel aperture, and this may not be representative of the whole aperture leading to poor corrections.

A further difficulty with both approaches is that the photo-sensitive devices conventionally sit under the aperture of the LED and due to step coverage problems, the photo sensors may induce non-uniformity in the pixel aperture, again leading to poor differential aging correction. The photodiode may create a vertical step of around 0.2-1.5 μm, and this is difficult to planarise. Thus, even for bottom emitting structures, the location of the photodiode beneath the pixel layer can cause problems.

According to the invention, there is provided an active matrix display device comprising an array of display pixels, each pixel comprising:

a current-driven light emitting display element comprising an area of light emitting material sandwiched between electrodes;

a light-dependent device for detecting the brightness of the display element; and a drive transistor circuit for driving a current through the display element, wherein the drive transistor is controlled in response to the light-dependent device output, wherein the light-dependent device is located laterally of the area of light emitting material.

By locating the light-dependent device to the side of the light emitting layer, the device does not cause step coverage problems in the light emitting material layer. Furthermore, the position of the light-dependent device to the side of the pixel aperture area enables the device to be integrated into the pixel layout without affecting the pixel aperture. Furthermore, the light dependent device can extend alongside the full length of the area of light emitting material so that it receives light input from a large part of the display element area.

The light-dependent device preferably comprises a photodiode, for example having a PIN or NIP diode stack and top and bottom contact terminals.

By receiving light laterally into such a structure, the efficiency of the light-dependent device can be improved, as losses through the top (or bottom) doped layers can be avoided, with light penetrating directly into the intrinsic layer.

The top contact terminal of the diode preferably extends over the top of the stack and down one side of the stack and acts as a light shield to pixels on that side of the photodiode. In this way, the diode configuration receives light laterally from one side, and provides shielding for light received laterally from the other side.

The display element electrodes may comprise a top substantially transparent electrode and a bottom substantially non-transparent, reflective electrode. This defines a top emitting configuration. The invention enables in-pixel photosensing to take place without requiring a reduction in pixel aperture in such a device.

The bottom electrode can be used not only for the display function, but also for reflecting light from the display element to the light dependent device. For example, the bottom electrode can reflect light emitted at an angle to the normal greater than a first angle to the light dependent device. Light emitted at an angle less than the first angle is then display light, and the light at greater than the first angle is essentially lateral illumination.

A further reflecting layer can be provided above the light dependent device and for reflecting reflected light from the reflecting bottom electrode to the light dependent device. Thus, a double reflection is provided to direct light laterally from the display element to the light-dependent device.

The device may further comprise a plurality of printing dams, and the light emitting material then comprises a printable material. In this case, the reflecting layer can be formed at the base of the printing dams. The light sensitive devices are then formed beneath the printing dams.

The printing dams may comprise an insulating body and a conducting metal layer over the insulating body. The conducting metal layer can then provide a lower resistance shunt connecting the top substantially transparent electrodes and it can also define the reflecting layer.

In another embodiment, the electrodes may comprise a top substantially transparent electrode and a bottom substantially transparent electrode, and the device further comprises an additional reflective layer beneath the bottom electrode. This provides a space between the display material layer and the bottom reflective electrode, which enables more laterally directed light to be captured by the light-dependent device. A top reflecting layer may again be provided above the light dependent device and for reflecting light from the bottom reflective layer to the light dependent device. This top reflecting layer can be formed at the level of the bottom electrode of the light emitting display element.

The light-dependent device can extend alongside the area of light emitting material and can extend along substantially the full length of one side of the area of light emitting material. It may also extend around an upper and lower portion of the area of light emitting material. This maximises the area of the light dependent device exposed to lateral light from the display element.

Examples of the invention will now be described in detail with reference to the accompanying drawings, in which:

FIG. 3 shows a first known optical feedback pixel design;

FIG. 4 shows a second known optical feedback pixel design;

FIG. 5 shows schematically pixels of a display device of the invention;

FIG. 6 shows a known structure of a bottom emitting display pixel;

FIG. 7 shows a known structure of a top emitting display pixel;

FIG. 8 shows a known structure of a bottom emitting display pixel incorporating a light sensitive element;

The same reference numbers are used throughout the Figures to denote the same or similar parts.

Figure 1:
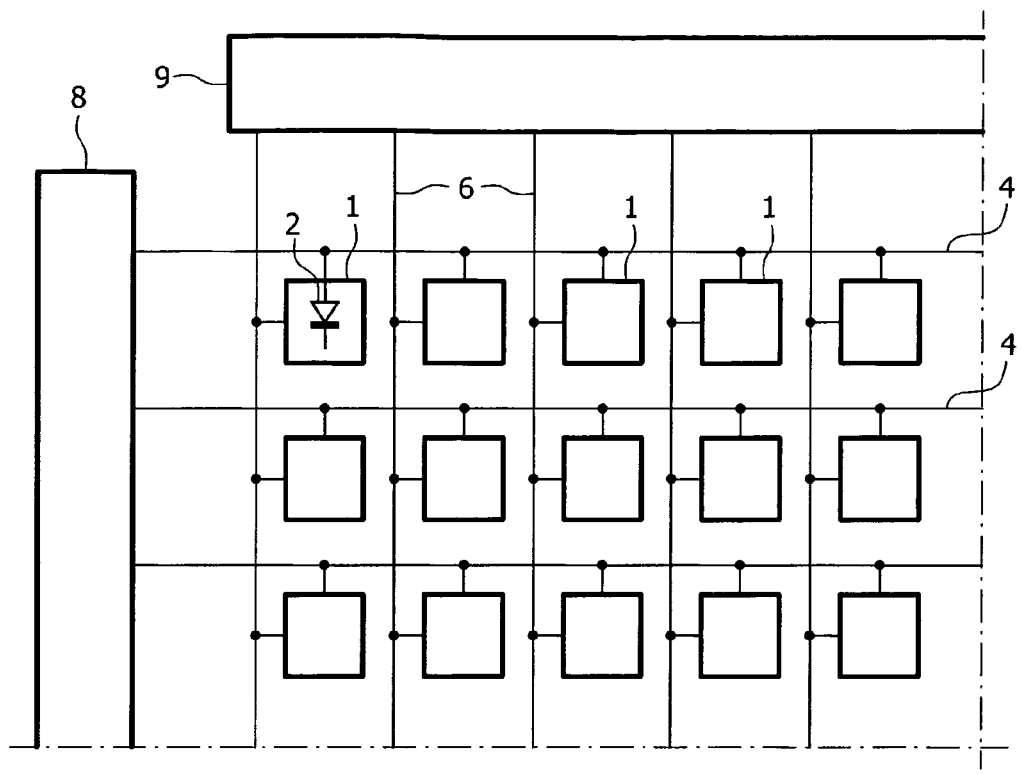
FIG. 1 is a simplified schematic diagram of an embodiment of active matrix EL display device.

FIG. 1 shows a known active matrix electroluminescent display device. The display device comprises a panel having a row and column matrix array of regularly-spaced pixels, denoted by the blocks 1 and comprising electroluminescent display elements 2 together with associated switching means, located at the intersections between crossing sets of row (selection) and column (data) address conductors 4 and 6. Only a few pixels are shown in the Figure for simplicity. In practice there may be several hundred rows and columns of pixels. The pixels 1 are addressed via the sets of row and column address conductors by a peripheral drive circuit comprising a row, scanning, driver circuit 8 and a column, data, driver circuit 9 connected to the ends of the respective sets of conductors.

The electroluminescent display element 2 comprises an organic light emitting diode, represented here as a diode element (LED) and comprising a pair of electrodes between which one or more active layers of organic electroluminescent material is sandwiched. The display elements of the array are carried together with the associated active matrix circuitry on one side of an insulating support. Either the cathodes or the anodes of the display elements are formed of transparent conductive material. The support is of transparent material such as glass and the electrodes of the display elements 2 closest to the substrate may consist of a transparent conductive material such as ITO so that light generated by the electroluminescent layer is transmitted through these electrodes and the support so as to be visible to a viewer at the other side of the support.

Figure 2:
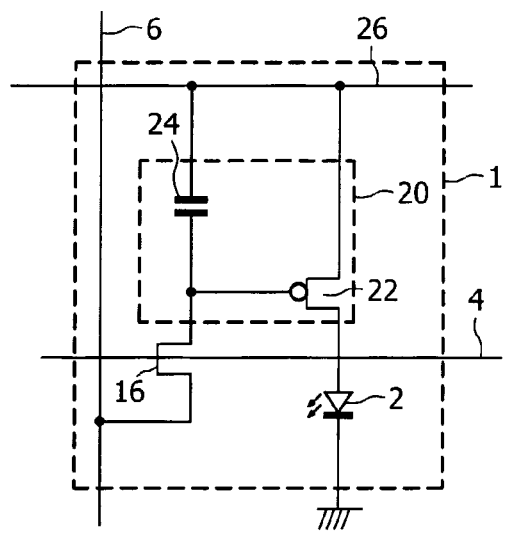
FIG. 2 illustrates a known form of pixel circuit.

FIG. 2 shows in simplified schematic form the most basic pixel and drive circuitry arrangement for providing voltage-addressed operation. Each pixel 1 comprises the EL display element 2 and associated driver circuitry. The driver circuitry has an address transistor 16 which is turned on by a row address pulse on the row conductor 4. When the address transistor 16 is turned on, a voltage on the column conductor 6 can pass to the remainder of the pixel. In particular, the address transistor 16 supplies the column conductor voltage to a current source 20, which comprises a drive transistor 22 and a storage capacitor 24. The column voltage is provided to the gate of the drive transistor 22, and the gate is held at this voltage by the storage capacitor 24 even after the row address pulse has ended.

The drive transistor 22 in this circuit is implemented as a p-type TFT, so that the storage capacitor 24 holds the gate-source voltage fixed. This results in a fixed source-drain current through the transistor, which therefore provides the desired current source operation of the pixel.

In the above basic pixel circuit, for circuits based on polysilicon, there are variations in the threshold voltage of the transistors due to the statistical distribution of the polysilicon grains in the channel of the transistors. Polysilicon transistors are, however, fairly stable under current and voltage stress, so that the threshold voltages remain substantially constant.

The variation in threshold voltage is small in amorphous silicon transistors, at least over short ranges over the substrate, but the threshold voltage is very sensitive to voltage stress. Application of the high voltages above threshold needed for the drive transistor causes large changes in threshold voltage, which changes are dependent on the information content of the displayed image. There will therefore be a large difference in the threshold voltage of an amorphous silicon transistor that is always on compared with one that is not. This differential ageing is a serious problem in LED displays driven with amorphous silicon transistors.

In addition to variations in transistor characteristics there is also differential ageing in the LED itself. This is due to a reduction in the efficiency of the light emitting material after current stressing. In most cases, the more current and charge passed through an LED, the lower the efficiency.

FIGS. 3 and 4 show examples of pixel layout with optical feedback to provide ageing compensation.

In the pixel circuit of FIG. 3, a photodiode 27 discharges the gate voltage stored on the capacitor 24 ($C_{data}$), causing the brightness to reduce. The display element 2 will no longer emit when the gate voltage on the drive transistor 22 ($T_{drive}$) reaches the threshold voltage, and the storage capacitor 24 will then stop discharging. The rate at which charge is leaked from the photodiode 27 is a function of the display element output, so that the photodiode 27 functions as a light-sensitive feedback device. Once the drive transistor 22 has switched off, the display element anode voltage reduces causing the discharge transistor 29 ($T_{discharge}$) to turn on, so that the remaining charge on the storage capacitor 24 is rapidly lost and the luminance is switched off.

As the capacitor holding the gate-source voltage is discharged, the drive current for the display element drops gradually. Thus, the brightness tails off. This gives rise to a lower average light intensity.

FIG. 4 shows a circuit which has been proposed by the applicant, and which has a constant light output and then switches off at a time dependent on the light output.

The gate-source voltage for the drive transistor 22 is again held on a storage capacitor 24 ($C_{store}$). However, in this circuit, this capacitor 24 is charged to a fixed voltage from a charging line 32, by means of a charging transistor 34. Thus, the drive transistor 22 is driven to a constant level which is independent of the data input to the pixel when the display element is to be illuminated. The brightness is controlled by varying the duty cycle, in particular by varying the time when the drive transistor is turned off.

The drive transistor 22 is turned off by means of a discharge transistor 36 which discharges the storage capacitor 24. When the discharge transistor 36 is turned on, the capacitor 24 is rapidly discharged and the drive transistor turned off.

The discharge transistor 36 is turned on when the gate voltage reaches a sufficient voltage. A photodiode 27 is illuminated by the display element 2 and again generates a photocurrent in dependence on the light output of the display element 2. This photocurrent charges a discharge capacitor 40 ($C_{data}$), and at a certain point in time, the voltage across the capacitor 40 will reach the threshold voltage of the discharge transistor 36 and thereby switch it on. This time will depend on the charge originally stored on the capacitor 40 and on the photocurrent, which in turn depends on the light output of the display element. The discharge capacitor initially stores a data voltage, so that both the initial data and the optical feedback influence the duty cycle of the circuit.

There are many alternative implementations of pixel circuit with optical feedback. FIGS. 3 and 4 show p-type implementations, and there are also n-type implementations, for example for amorphous silicon transistors.

The invention will now be described generally with reference to FIG. 5.

As shown in FIG. 5, each pixel 50 has a light-dependent device 52 located laterally with respect to the pixel electrode 54. The design of the device 52, preferably a PIN or NIP diode or Schottky diode, is to allow lateral illumination from the pixel of interest 50a but to act as a light shield to a neighbouring pixel 50b.

The photodiode 52 is constructed outside the pixel apertures. In some embodiments, the lateral illumination allows the NIP/PIN device to have its top window covered with metal, so that the passage of ambient light to the sensor can also be reduced.

The efficiency of the NIP/PIN photodiode used in this manner will be good across all wavelengths, as absorption losses in the N and P layers of the device are no longer seen as light can enter through the side of the device. The light level will be lower than if the device were directly under the aperture so a large photodiode is preferred as shown in FIG. 5. This removes the non-uniformity effects of very small devices.

In other embodiments, the laterally positioned photodiode can still receive light from above using reflecting paths.

The arrangement of the invention is particularly suitable for display devices which emit light through the cathode (top emission) rather than devices that emit light through the anode (bottom emission). The reason for this will become apparent from the discussion below of the conventional pixel layouts for top and bottom emission.

FIG. 6 shows the known basic bottom emission structure including the active matrix.

The device comprises a substrate 60 over which the drive transistor semiconductor body 62 is deposited. A gate oxide dielectric layer 64 covers the semiconductor body, and a top gate electrode 66 is provided over the gate dielectric layer 64.

A first insulating layer 68 (typically silicon dioxide or silicon nitride) provides spacing between the gate electrode (which typically also forms row conductors) and the source and drain electrodes. These source and drain electrodes are defined by a metal layer 70 over the insulator layer 68, and the electrodes connect to the semiconductor body through vias as shown.

A second insulating layer 72 (again typically silicon dioxide or silicon nitride) provides spacing between the source and drain electrodes (which typically also form column conductors) and the LED anode. The LED anode 74 is provided over the second insulating layer 72.

In the case of a bottom emission display as shown in FIG. 6, this bottom anode needs to be at least partially transparent, and ITO is typically used.

The EL material 76 is formed in a well over the anode, and is preferably deposited by printing. Separate sub-pixels are formed for the three primary colours, and a print dam 78 assists in the accurate printing of the different EL materials.

The print dam 78 enables printing of separate pixels. This dam layer is generally made of an insulating polymer and has a height of several microns. A common cathode 80 is provided over the display, and this is reflective and at a common potential for all pixels (ground in FIG. 2).

FIG. 7 shows the basic known top emission structure including the active matrix. The structure is essentially the same as in FIG. 6, but the anode 74a is reflective and the cathode 80a is transmissive. The cathode may again be formed from ITO, but may have a thin metal, combination of several metals (e.g. Bg/Ag), or silicide coating between the ITO and polymer to control the barrier for electron injection. For example, this may be a thin 5 nm layer of Barium/20 nm layer of Silver. Protection and encapsulation layers 82 cover the display.

In a top-emission display, a transparent cathode is needed. The cathode does, however, have to be highly conductive, and at present highly conductive transparent metals are not readily available. Therefore the cathode of top-emission displays comprises a (semi-) transparent layer on top of the emissive pixel part and shunted with a lower resistance conducting (non-transparent) metal 79. By placing this highly conductive metal 79 on top of the dam 78 as shown, there is no loss in pixel aperture.

According to the electrical characteristics of the materials, the anode metal can be a high work function metal, and it is known to provide a layer of ITO on top of a reflective metal to achieve a high work function into the LED stack. In this way, the anode electrode can also satisfy requirements relating to the physical properties of the electroluminescent materials, for example the wetting of the polymers.

FIG. 8 shows the integration of an amorphous silicon PIN/NIP photo-diode 84 in a bottom emitting structure, in conventional manner. This type of photo-sensor is preferred as the amorphous silicon has high quantum efficiency for photo absorption.

This type of photo-sensor is ideal for bottom emission as the gate metal which is used to form the bottom electrode 86 of the diode stack screens the photo-sensor from external light 87. An open top aperture of the diode stack, shown schematically in FIG. 8, allows in light from the LED as shown by arrow 88.

The positioning of the sensor, beneath the anode layer is clearly not appropriate for top emission where the anode is a reflective and opaque metal. Furthermore, the diode can give rise to step coverage problems in the electroluminescent material layer, giving non-uniformity of pixel characteristics.

Figure 9:
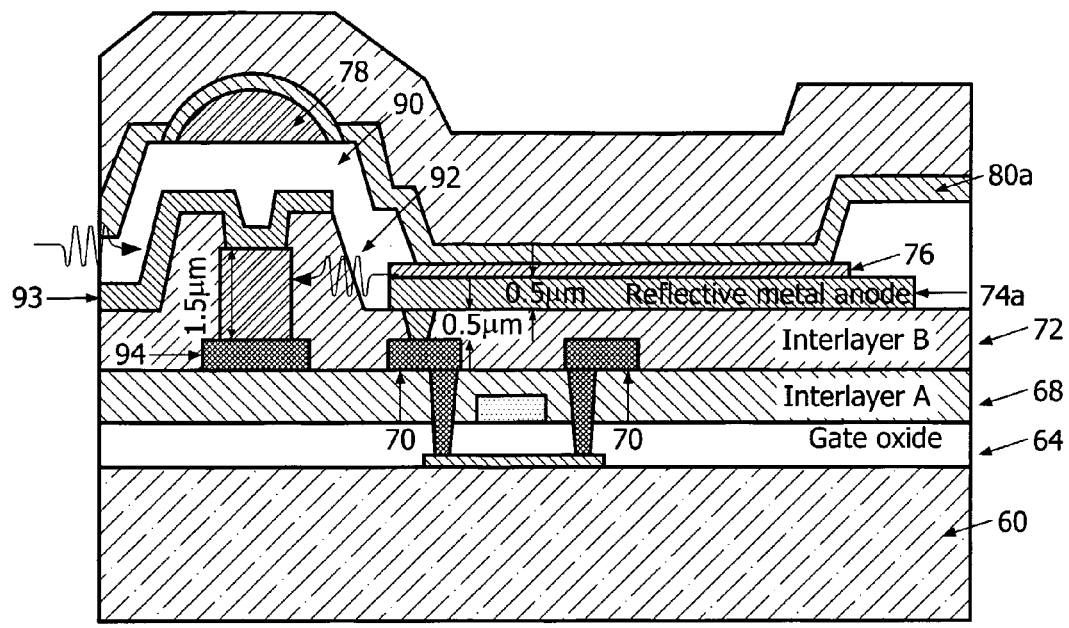
FIG. 9 shows a first example of a top emitting display pixel structure incorporating a light sensitive element in accordance with the invention.

FIG. 9 shows in more detail a first implementation of the invention for use in a top emission structure. Where the components in FIG. 9 correspond to those in FIGS. 6 and 7, the same references are used and the description is not repeated.

The photodiode 90 is positioned at the side of the EL material area of the display, and comprises an NIP/PIN stack for example of height approximately 1.5 μm. The photodiode is illuminated by light emitted from the side of the LED aperture as shown by arrow 92. The diode stack is sandwiched between top and bottom electrodes 93, 94, and in the structure shown, the bottom electrode is formed from the source/drain metal layer 70 and the top electrode 93 is formed from the anode metal layer 74a. The top electrode covers the top of the diode stack so that the device is illuminated laterally only. The top electrode 93 also shields the diode stack from illumination from one side as well as from above.

The photodiode is constructed under the print dam 78 and therefore has no effect upon the top emission aperture. Light from the LED must enter the side wall of the diode, and for this purpose, the diode must have a large height. A suitable amorphous silicon diode height is 1.5 μm although it may be lower, for example 200 nm-1 μm.

FIG. 9 gives example layer thickness for the insulator layer 72 above the source/drain and for the anode metal. These heights allow vertical adjustment of the LED layer 76 with respect to the diode stack. A diode of 1.5 μm height is sufficient to gather light from the LED. Thinning the anode metal can enable the diode to gather more light as the LED will emit upwardly, so the more of the photodiode above the plane of the electroluminescent layer, the more light it will gather.

A thick amorphous silicon photodiode presents no extra planarisation issues because the diode is not under the LED aperture. The layer 72 planarises the TFTs under the pixel aperture.

The diode should be made as long as possible, preferably the same length as a dimension of the aperture, to gather as much light as possible. Its width can be limited to a few microns because the wall width is simply required to absorb red photons. This is also advantageous because the dam width is likely to be narrow in pixel designs at high resolution.

The screening of the photodiode from external light is achieved by the top diode contact formed using the anode metal, as mentioned above. Even light entering the display at a very shallow angle will be refracted strongly towards the display normal (as the materials used have a high refractive index e.g. n>1.8) so that the top contact anode metal still blocks this light. The diode should also be screened from light from neighbouring pixels by making sure the metal anode making the top contact on the diode of acts as a light block as shown in FIG. 9.

In the examples above, the photodiode is illuminated only laterally. However, it is possible to provide vertical illumination or to allow vertical and lateral illumination.

The scheme in FIG. 9 only collects light on a diode edge, and the vertical position of the photodiode must accordingly be set and controlled precisely.

Figure 10:
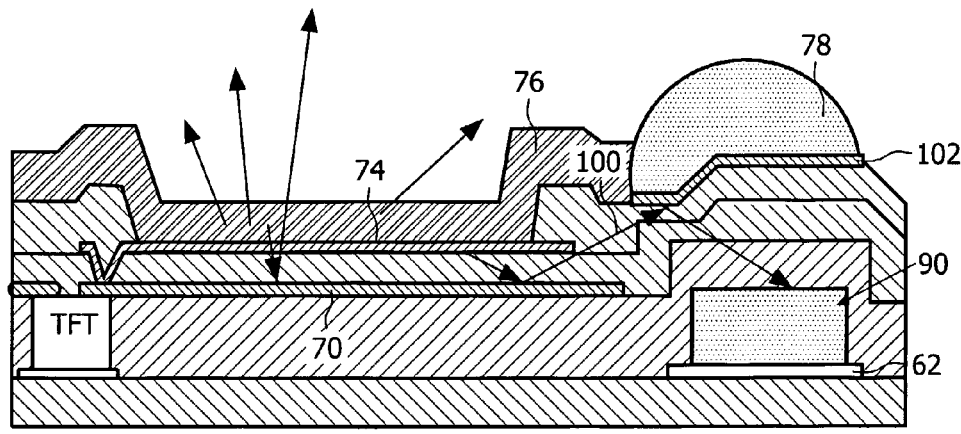
FIG. 10 shows a second example of a top emitting display pixel structure incorporating a light sensitive element in accordance with the invention.

FIG. 10 shows (more schematically) a modification in which a reflective path is defined between the display material 76 and the photodiode 90. This enables the photodiode to collect light over an area rather than an edge, and allows more flexibility in the vertical positioning of the photodiode within the layer structure. FIG. 10 shows only the layers relevant to the modification, and is a partial representation of the device.

In FIG. 10, the column metal 70 is used to reflect the downwardly directed light, rather than a reflective anode. The LED anode 74 is transparent and connects to the column metal layer 70 through a via, as shown. The photodiode 90 is now positioned out of the direct line of sight of the LED layer 76, and it is placed at the level of the gate metal 62 instead of at the column metal level as in FIG. 9. Direct light collected may cause non-uniformity due to sensitivity to the precise vertical position, and the embodiment of FIG. 10 reduces this sensitivity.

In order to reflect light into the photodiode through a top surface, the reflector under the pixel should ideally be as deep as possible under the ITO anode 74, and should also extend laterally beyond the ITO anode 74 as shown in FIG. 10, to increase the angle of collection.

As shown in FIG. 10, the column metal 70 provides a first reflection of downwardly directed light. Light emitted at an angle to the normal greater than a minimum will be reflected and directed essentially laterally and with an upward component (arrow 100). A reflecting layer 102 is provided above the photodiode 90 for providing a second reflection for this light component to the photodiode. For this purpose, the print dam polymer can be used as a mask for etching a reflecting layer to leave the reflector 102 at the base of the printing dams 78.

This reflector 102 directs light to the top of the photodiode but also acts as a light shield for ambient light.

Figure 11:
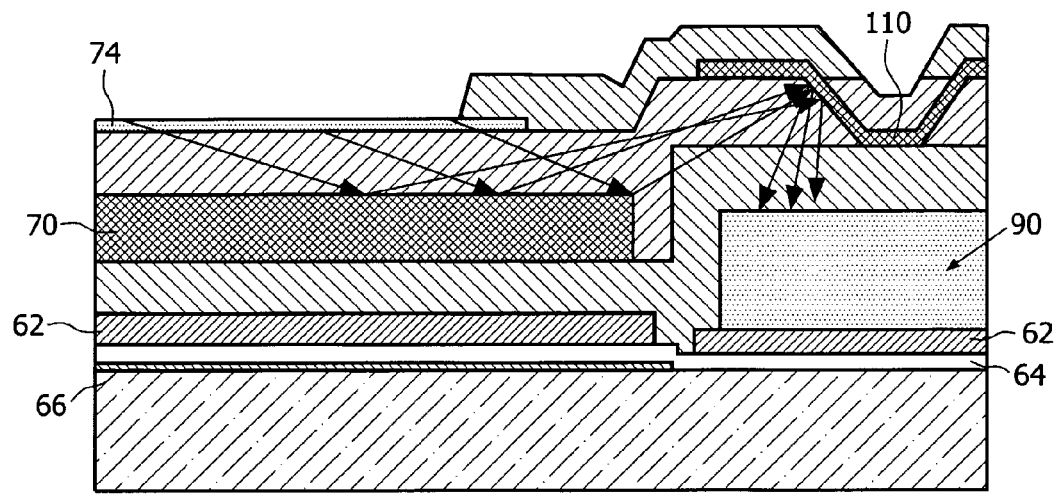
FIG. 11 shows a third example of a top emitting display pixel structure incorporating a light sensitive element in accordance with the invention.

FIG. 11 shows a variation to FIG. 10, in which the top mirror 110 is added at the level of the ITO anode 74. Again, the first reflection is provided by the column metal layer 70. FIG. 11 also shows more clearly the photodiode 90 formed on the gate metal layer 62, and also shows the TFT semiconductor layer 66 and gate dielectric layer 64.

The processing stage for connecting the ITO anode 74 to the column metal layer using vias can also be used to form an angled mirror 110 for higher efficiency, as shown in FIG. 11. The other levels under the LED (such as the gate metal 62 and semiconductor layers 66) can also be used to adjust the height of the pixel with respect to the photodiode, as necessary to control light angles. The LED and top layers, as well as the printing dam, are not shown in FIG. 11.

Figure 12:
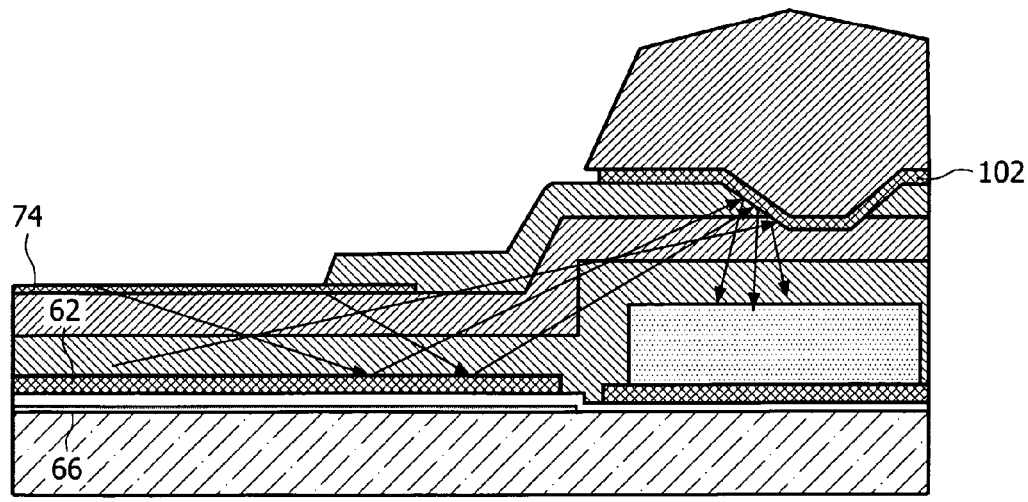
FIG. 12 shows a fourth example of a top emitting display pixel structure incorporating a light sensitive element in accordance with the invention.

FIG. 12 shows a further modification in which the height difference between the two mirrors is further increased to improve light collection efficiency. The dam polymer is again used to define the mirror 102 at the higher level, but the gate metal layer 62 rather than the column metal is used to define the bottom mirror. The top mirror metal can also be etched under the dam 78 to provide an angled profile, and this can reduce any pixel to pixel leakage. The semiconductor layer 66 can also be removed from under the gate metal portion forming the bottom reflector to give increased separation, or left in place as shown. This semiconductor layer has high surface roughness, which propagates up through to the gate metal layer, and this roughness may enhance light scattering to the shallow angles.

The example of FIG. 12, with the gate metal used as a reflector, gives giving maximum ITO layer 74 to reflector separation. Having the top reflector as high up the structure as possible also enables light to be collected over a wider range of angles.

Figure 13:
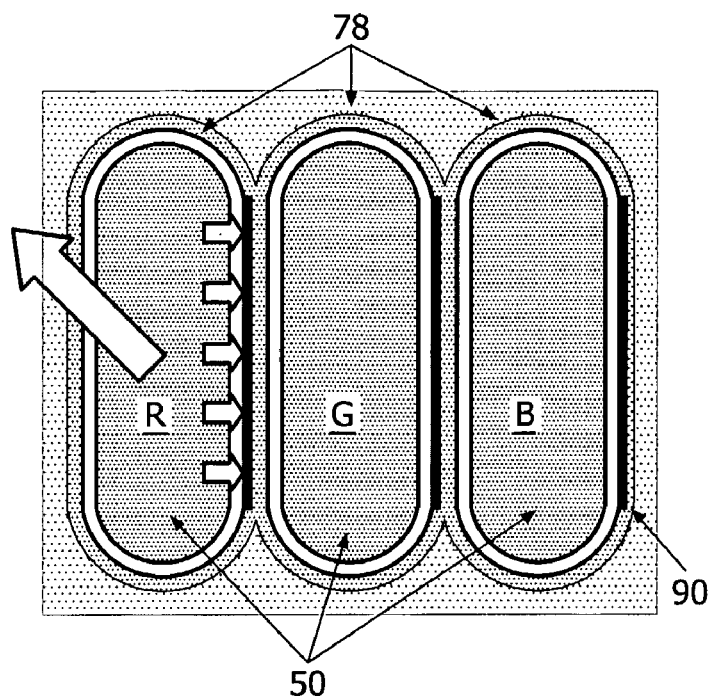
FIG. 13 shows one way in which the invention can be applied to a triplet of display sub-pixels.

The pixels of a colour display are grouped into sub-pixels of different colours, and FIG. 13 shows for completeness a top view of a triplet of three active matrix LED pixels 50 (R, G, B), the dams 78 and the photo-sensors 90 at one side of the pixel underneath the dam.

Figure 14:
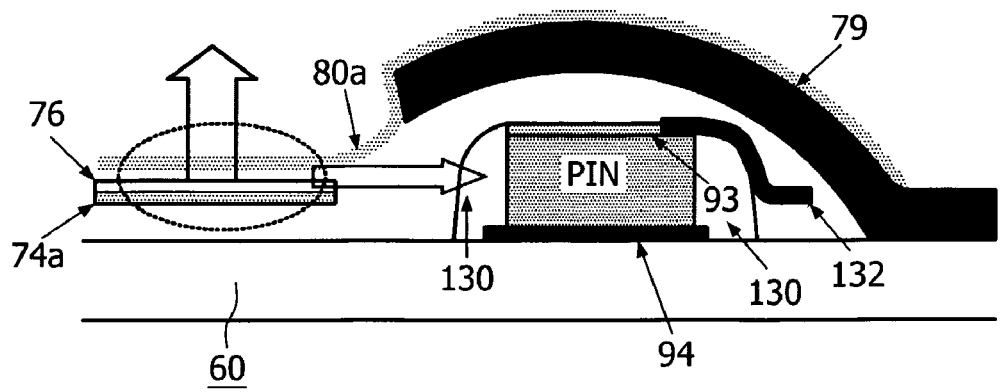
FIG. 14 is a cross section from FIG. 13.

FIG. 14 shows a cross section of the combination of the pixel and dam. For good operation of the diode it is important to reduce the leakage current. This can be provided for by placing isolating spacers 130 at both sides of the diode to decrease current leakage at the sidewalls. FIG. 14 also shows a further method of reducing optical crosstalk, in which the cathode shunt metal 79 on top of the dam is asymmetric. At the right side of the dam, the metal 79 shields the photo-sensor from light emitted by the neighbouring pixel, and this can be used in combination with the use of the top electrode as discussed above (for example as shown by contact 132).

The area of the photodiode that receives light is given by the area of the sidewall facing the LED layer. Since the height of the diode stack may be 1.5 μm or less, the area may be very small. As mentioned above, although the height of the diodes is preferably relatively low, the width can be as large as the pixel length, as shown in FIG. 13.

Figure 15:
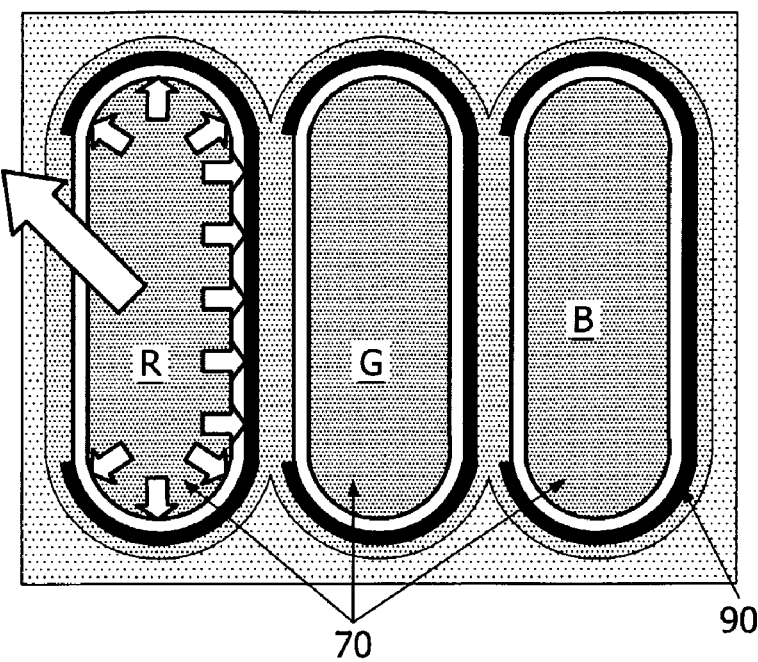
FIG. 15 shows a second way in which the invention can be applied to a triplet of display sub-pixels.

The length of the exposed side wall of the diode stack can be increased further as shown in FIG. 15. In this case, most of the circumference of the pixel active area is used to illuminate a photodiode, excluding one edge (the left edge in FIG. 15). At this edge, the photodiode of the neighbouring pixel is positioned.

This configuration increases further the amount of light sensed by the photo diode.

Figure 16:
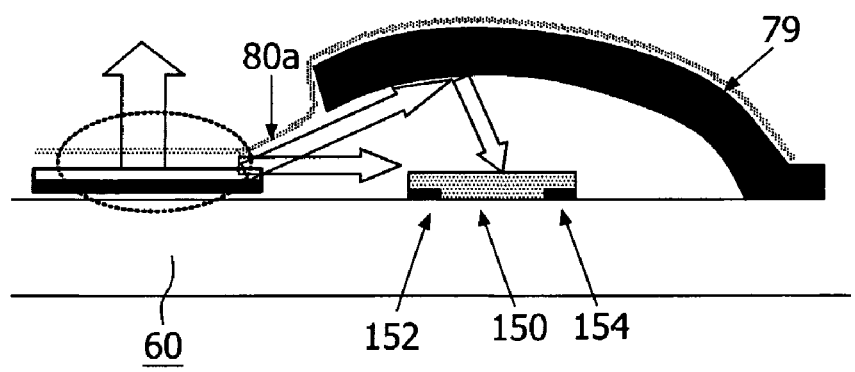
FIG. 16 shows a fifth example of a top emitting display pixel structure incorporating a light sensitive element in accordance with the invention and using a photosensitive transistor.

The examples above all use photodiode light sensors. An amorphous silicon photo TFT can also be used, as shown in FIG. 16. This consists of an amorphous silicon layer 150 on top of a source 152 and drain 154 electrode. Photons absorbed in the channel between source and drain generate a photocurrent which can be sensed by the source and drain electrodes. The photocurrent can also be influenced by application of a gate electrode on top of the amorphous silicon layer.

The metal dam can in this case be used both as the gate of the amorphous silicon photo TFT and the shunt 79 between cathodes. Light emitted at a slight angle to the substrate may again be reflected by the inside of the metal 79 towards the photo TFT, increasing the size of the photocurrent. The embodiment of FIG. 15 uses a dam formed from an insulating transparent material covered by the shunt metal 79.

A low temperature polysilicon photo TFT can also be used as the photosensitive device, with a resulting geometry similar to FIG. 16.

Display devices of the invention will find particular application as flat panel displays in mobile applications (Phone, PDA, digital camera), in (laptop) monitors, and in televisions. The invention also provides a solution to avoid ambient light sensitivity in trans-emissive displays, for example for use in window or head mounted displays. In the case of a trans-emissive display, daylight from the other side can be shielded for example by the power supply line.

The processes involved in the manufacture of the display devices of the invention have not been described in this application, as they will be conventional and routine to those skilled in the art. Amorphous silicon, polysilicon, microcrystalline silicon or other semiconductor transistor technologies may be employed. The invention can be applied to any pixel circuit in which a photosensitive device is used as a feedback element for each pixel.

As explained above, the invention provides particular advantages for top emission device structures. However, the invention can also be used to improve light collection efficiency and remove step coverage problems in bottom emission display structures.

From reading the present disclosure, other modifications will be apparent to persons skilled in the art.

The invention claimed is:

1. An active matrix display device comprising a plurality of printing dams and an array of display pixels, each pixel comprising:
   a current-driven light emitting display element comprising an area of light emitting material sandwiched between electrodes;
   a light-dependent device for detecting the brightness of the display element,
   wherein the light-dependent device is located laterally outside of the area of the light emitting material defined by the vertical planar edges of the light emitting layer of the light emitting material, and separated from the light emitting material by at least one insulating layer,
   wherein the vertical planar edges of the light emitting material are defined in a direction between a top and a bottom electrode of the light-dependent device
   wherein the light dependent device is located in the same horizontal plane as the light emitting material of the light emitting display element and is configured to enclose the light emitting material on at least three sides, and
   wherein the light dependent device is directly illuminated from light emitted from a side face of the light emitting display element and travels in a horizontal plane from said light emitting display to said light dependent device,
   wherein the light-dependent device is formed beneath one of said plurality of printing dams,
   a drive transistor circuit for driving a current through the display element, wherein the drive transistor is controlled in response to the light-dependent device output.

2. A device as claimed in claim 1, wherein the light-dependent device comprises a photodiode.

3. A device as claimed in claim 2, wherein the photodiode comprises a PIN or NIP diode stack or a Schottky diode and top and bottom contact terminals.

4. A device as claimed in claim 3, wherein the top contact terminal extends over the top of the stack and down one side of the stack and acts as a light shield to pixels on the one side of the photodiode.

5. A device as claimed in claim 1, wherein the electrodes comprise a top substantially transparent electrode and a bottom substantially non-transparent, reflective electrode.

6. A device as claimed claim 5, wherein the bottom electrode is for reflecting light from the display element to the light dependent device.

7. A device as claimed in claim 6, wherein the bottom electrode is for reflecting light emitted at an angle great enough to reach the light dependent device.

8. A device as claimed in claim 6, further comprising a reflecting layer above the light dependent device and for reflecting light from the bottom electrode to the light dependent device.

9. A device as claimed in claim 8, wherein the light emitting material comprises a printable material.

10. A device as claimed in claim 9, wherein the reflecting layer is formed at the base of the printing dams.

11. A device as claimed in claim 9, wherein the printing dams comprise an insulating body and a conducting metal layer over the insulating body.

12. A device as claimed in claim 11, wherein the conducting metal layer provides a low resistance shunt connecting the top substantially transparent electrodes.

13. A device as claimed in claim 11, wherein the conducting metal layer defines the reflecting layer.

14. A device as claimed in claim 1, wherein the electrodes comprise a top substantially transparent electrode and a bottom substantially transparent electrode.

15. A device as claimed in claim 14, wherein the device further comprises an additional reflective layer beneath the bottom electrode.

16. A device as claimed in claim 15, further comprising a reflecting layer above the light dependent device and for reflecting light from the reflecting layer to the light dependent device.

17. A device as claimed in claim 16, wherein the light emitting material comprises a printable material.

18. A device as claimed in claim 17, wherein the reflecting layer is formed at the base of the printing dams.

19. A device as claimed in claim 1, wherein the light-dependent device extends alongside the area of light emitting material and extends along substantially the full length of one side of the area of light emitting material.

20. A device as claimed in claim 19, wherein the light-dependent device extends around an upper and lower portion of the area of light emitting material.

21. A device as claimed in claim 1, wherein the light emitting display element comprises an electroluminescent display element.

* * * * *